(12) United States Patent
Mulkens

(10) Patent No.: US 6,522,387 B2
(45) Date of Patent: Feb. 18, 2003

(54) MICROLITHOGRAPHY PROJECTION APPARATUS

(75) Inventor: Johannes C Mulkens, Maastricht (NL)

(73) Assignee: ASML Netherlands B.V., Veldhoven (NL)

(*) Notice: Subject to any disclaimer, the term of this patent is extended or adjusted under 35 U.S.C. 154(b) by 11 days.

(21) Appl. No.: 09/761,837

(22) Filed: Jan. 18, 2001

(65) Prior Publication Data

US 2001/0012101 A1 Aug. 9, 2001

(30) Foreign Application Priority Data

Jan. 20, 2000 (EP) .......................................... 00300418

(51) Int. Cl.[7] .................... G03B 27/68; G03B 27/42; G03B 27/54
(52) U.S. Cl. ................ 355/52; 355/53; 355/67
(58) Field of Search ............... 355/53, 67, 71, 355/68, 69, 70, 52, 55

(56) References Cited

U.S. PATENT DOCUMENTS

| | | | | |
|---|---|---|---|---|
| 5,739,899 A | * | 4/1998 | Nishi et al. | 355/53 |
| 6,310,680 B1 | * | 10/2001 | Taniguchi | 355/53 |
| 6,333,777 B1 | * | 12/2001 | Sato | 355/53 |

* cited by examiner

*Primary Examiner*—Alan A. Mathews
(74) *Attorney, Agent, or Firm*—Pillsbury Winthrop LLP

(57) ABSTRACT

A microlithography projection apparatus comprises an illuminator, for supplying a beam of radiation for illuminating a pattern on a mask, and a projection system for forming an image of the illuminated portion of the mask on a resist-coated substrate. The image is projected off-axis with respect to the optical axis of the projection system and the aperture of the illuminator is minimized to that of the illuminated portion of the mask. The illuminator is provided with a compensator, such as a tiltable mirror or wedge-like transmissive optical element for compensating for telecentricity errors intrinsic to the projection system.

14 Claims, 3 Drawing Sheets

(a)

(b)

MICROLITHOGRAPHY PROJECTION APPARATUS

BACKGROUND OF THE INVENTION

1. Field of the Invention

The present invention relates to telecentricity error compensation in a lithographic projection apparatus comprising:

- a radiation system for supplying a projection beam of radiation;
- patterning means, for patterning the projection beam according to a desired pattern;
- a substrate table for holding a substrate; and
- a projection system for imaging the patterned beam onto a target portion of the substrate.

2. Description of the Related Art

The term "patterning means" should be broadly interpreted as referring to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device (see below). Examples of such patterning means include:

- A mask table for holding a mask. The concept of a mask is well known in lithography, and its includes mask types such as binary, alternating phase-shift, and attenuated phase-shift, as well as various hybrid mask types. Placement of such a mask ("reticle") in the radiation beam causes selective transmission (in the case of a transmissive mask) or reflection (in the case of a reflective mask) of the radiation impinging on the mask, according to the pattern on the mask. The mask table ensures that the mask can be held at a desired position in the incoming radiation beam, and that it can be moved relative to the beam if so desired.
- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference.
- A programmable LCD array. An example of such a construction is given in U.S. Pat. No. 5,229,872, which is incorporated herein by reference.

For the sake of simplicity, the rest of this text may, at certain locations, specifically direct itself to examples involving a mask table and mask; however, the general principles discussed in such instances should be seen in the broader context of the patterning means as hereabove set forth.

For the sake of simplicity, the projection system may hereinafter be referred to as the "lens"; however, this term should be broadly interpreted as encompassing various types of projection system, including refractive optics, reflective optics and catadioptric systems, for example. The radiation system generally comprises an illumination system ("illuminator"), which may also include elements operating according to any of these design types for directing, shaping or controlling the projection beam of radiation, and such elements may also be referred to below, collectively or singularly, as a "lens". Further, the lithographic apparatus may be of a type having two or more mask tables and/or two or more substrate tables. In such "multiple stage" devices the additional tables may be used in parallel, or preparatory steps may be carried out on one or more tables while one or more other tables are being used for exposures. Twin stage lithographic apparatus are described in, for example, U.S. Pat. No. 5,969,441 and U.S. Ser. No. 09/180,011, filed Feb. 27, 1998, (WO 98/28665 and WO 98/40791), incorporated herein by reference.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (comprising one or more dies) on a substrate (silicon wafer) which has been coated with a layer of photosensitive material (resist). In general, a single wafer will contain a whole network of adjacent target portions which are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus (which is commonly referred to as a step-and-scan apparatus or scanner) each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

As demand for imaging ever-smaller features at higher densities increases, it is necessary to use shorter wavelength radiation, for example ultraviolet light with a wavelength of 157 nm or 126 nm. However, this can result in problems caused by chromatic aberration which can degrade the performance of the projection apparatus. Two reasons for this are that, firstly, radiation sources, such as lasers, for producing shorter wavelength radiation tend to have greater line widths, i.e. the source is less monochromatic and contains a broader spread of wavelengths; and, secondly, the dispersion relation of refractive index against wavelength for refractive media used for the lenses tends to have a steeper gradient at shorter wavelengths, and therefore the media are more dispersive, which results in increased chromatic aberration. One solution to this problem is to design a projection lens that is achromatic, for example by combining lens elements which have powers of opposite sign, and which are made of lens materials having different dispersion relations, such that the chromatic aberration is substantially canceled out. However, this increases the complexity and expense of the lens systems, since two different media are requited. Also, the number of possible refractive media decreases when light with a relatively short wavelength is used. This makes it very difficult to make a projection lens that is achromatic.

An alternative solution is to use a catadioptric lens system, which includes at least one reflective optical element. This enables a single material to be used for all the lenses. However, the use of reflective elements in some projection system designs means that an image must be projected off-axis to avoid part of it being obscured by certain elements in the system. This means that the projected image does not span the optical axis (i.e. the center) of the projection system. An example of a catadioptric lens can be found, for example, in U.S. Pat. No. 5,537,260, incorporated herein by reference.

However, such a projection system will generally have an intrinsic telecentricity error. There is a problem of simultaneously compensating for this error whilst minimizing the size of the illumination system lenses in an off-axis projection system.

SUMMARY OF THE INVENTION

An object of the present invention is to provide an improved microlithography projection apparatus which avoids or alleviates the above problems.

According to the present invention there is provided a microlithography projection apparatus as specified in the opening paragraph, arranged such that, in use, the patterned beam is projected off-axis with respect to the optical axis of said projection system, characterized by further comprising a compensating means ("compensator") for compensating for telecentricity error of the projection system.

The compensator enables the telecentricity error of the projection system to be corrected for, at least partially, in an off-axis projection system, e.g. one which is catadioptric and where the patterned projection beam traverses the projection system off-axis, to avoid said obscuration.

Since the patterned beam is projected off axis, as explained above, the irradiated area in the plane of the mask shall also be laterally displaced with respect to the optical axis of the projection system. Preferably, the optical axis of the illuminator is laterally shifted such as to be parallel to, but off-axis with respect to, the optical axis of the projection system, and such that it is substantially centered with respect to said irradiated area. This enables the size of the illuminator and its lenses and optical components to be minimized.

Preferably, the compensator is tilted with respect to the emergent optical axis of the illuminator. This is a relatively simple modification to enable the illumination system to be compensated for a telecentricity error in the projection system.

Preferably, the compensator is tiltable, to allow for adjustment of the telecentricity error compensation.

Preferably, the compensator comprises a reflective element. This can comprise, for example, a mirror in the illuminator, and enables a pre-existing mirror to have the double function of both deflecting the beam and correcting for telecentricity error.

Although the reflective element, such as a mirror, is typically planar, which permits at least coarse compensation for telecentricity error, it is also possible for the reflective element to have a non-planar profile, to allow telecentricity compensation to vary with position in the beam.

According to an alternative aspect of the invention, preferably the compensator comprises a wedge-like transmissive optical element. Preferably the wedge-like optical element comprises a portion of an axially symmetric lens. This has the advantage that the lens can be manufactured by standard techniques, to provide accurate compensation for the telecentricity error with the appropriate symmetry, and then the lens can be cut up to give the wedge-like portion for insertion in the beam path to compensate for the telecentricity error, notwithstanding the fact that the apparatus comprises an off-axis projection system. An additional advantage is now that more than one wedge-like optical element compensator can be obtained from a single lens.

According to one aspect of the invention, in an embodiment employing a mask table, the wedge-like optical element is located proximate to a position at which a mask is held, in use, by said mask table, or at a position substantially conjugate thereto. This has the advantage that telecentricity error compensation essentially requires adjustment of the angle of incidence/exit of the light beam on the mask as a function of position across the mask (i.e., the compensator acts as a decentered field lens).

According to a further aspect of the invention there is provided a device manufacturing method comprising the steps of:

providing a substrate that is at least partially covered by a layer of radiation-sensitive material;

providing a projection beam of radiation using an illumination system;

using patterning means to endow the projection beam with a pattern in its cross-section;

projecting the patterned beam of radiation onto a target area of the layer of radiation-sensitive material, characterized in that, prior to patterning, the projection beam is projected off-axis with respect to the optical axis of said projection system, and a compensation is performed to compensate for telecentricity error of the projection system.

In a manufacturing process using a lithographic projection apparatus according to the invention a pattern (e.g. in a mask) is imaged onto a substrate that is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms radiation, radiation beam, and beam are, in principle, used to encompass all types of electromagnetic radiation, including ultraviolet radiation (e.g. with a wavelength of 365, 248, 193, 157 nm or 126 nm) and EUV.

BRIEF DESCRIPTION OF THE DRAWINGS

Embodiments of the invention will now be described, by way of example only, with reference to the accompanying schematic drawings in which.

In the Figures, corresponding reference symbols or numerals indicate corresponding parts.

DETAILED DESCRIPTION OF THE INVENTION

Figure 1:
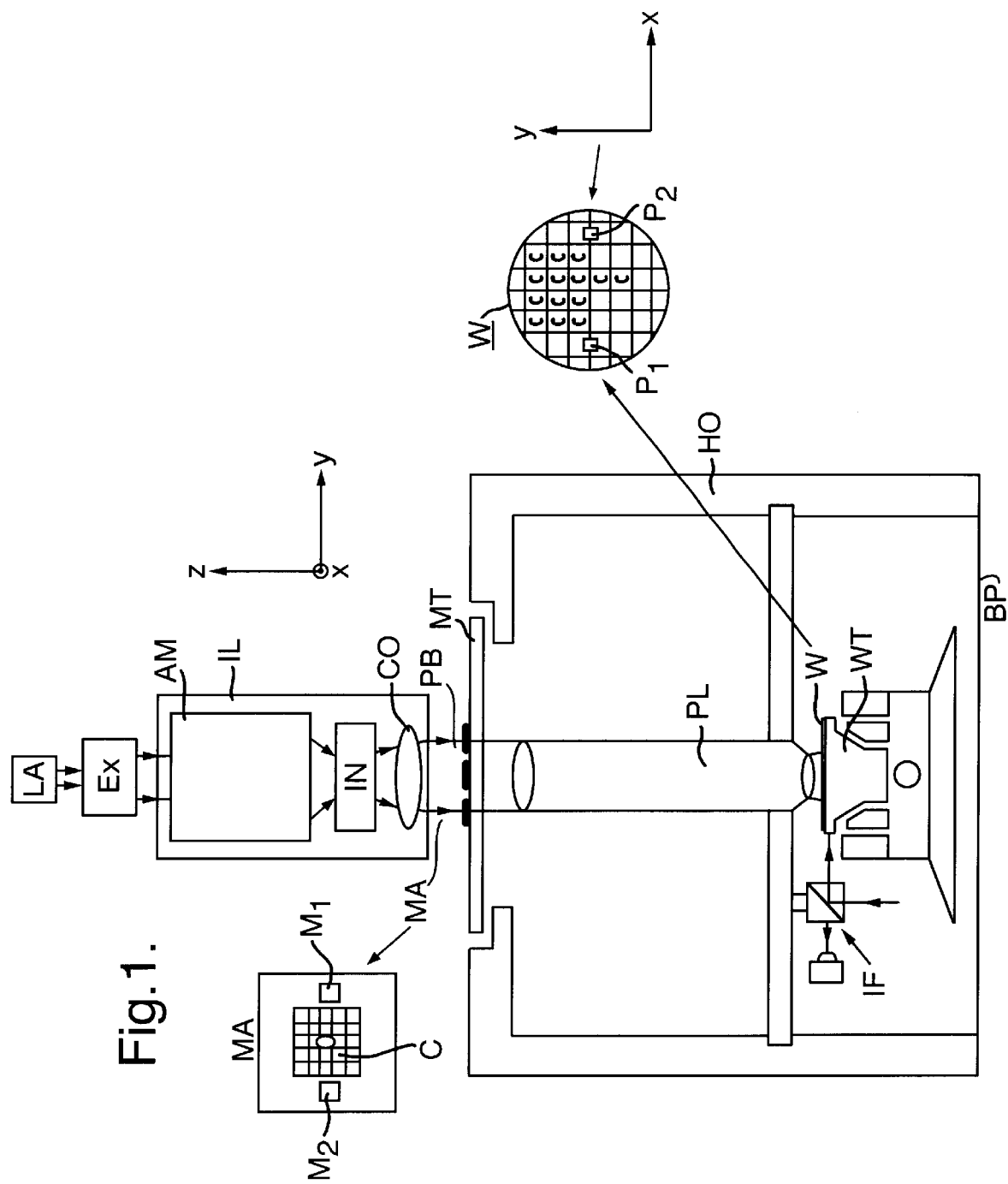
FIG. 1 depicts a lithographic projection apparatus according to an embodiment of the invention.

FIG. 1 schematically depicts a lithographic projection apparatus according to the invention. The apparatus comprises:

- a radiation system LA, Ex, IL, for supplying a projection beam PB of radiation (e.g. UV or EUV radiation);
- a first object table (mask table) MT provided with a mask holder for holding a mask MA (e.g. a reticle);
- a second object table (substrate table) WT provided with a substrate holder for holding a substrate W (e.g. a resist-coated silicon wafer);
- a projection system ("lens") PL (e.g. a refractive or catadioptric system, or a mirror group) for imaging an irradiated portion of the mask MA onto a target portion C (comprising one or more dies) of the substrate W.

As here depicted, the apparatus is of a transmissive type (i.e. has a transmissive mask). However, in general, it may also be of a reflective type, for example (with a reflective mask).

The radiation system comprises a source LA (e.g. a Hg lamp or excimer laser) which produces a beam of radiation. This beam is fed into an illumination system IL, either directly or after being passed through conditioning means, such as a beam expander Ex, for example. The illuminator IL comprises adjusting means AM for setting the outer and/or inner radial extent (i.e. σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA which is held in a mask holder on a mask table MT. Having traversed the mask MA, the beam PB passes through the lens PL, which focuses the beam PB onto a target portion C of the substrate W. With the aid of the interferometric displacement and measuring means IF, the substrate table WT can be moved accurately, e.g. so as to position different target areas C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long stroke module (course positioning) and a short stroke module (fine positioning), which are not explicitly depicted in FIG. 1. However, in the case of a waferstepper (as opposed to a step-and-scan device) the mask table MT may be just connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB (now generally in the form of a slit) is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
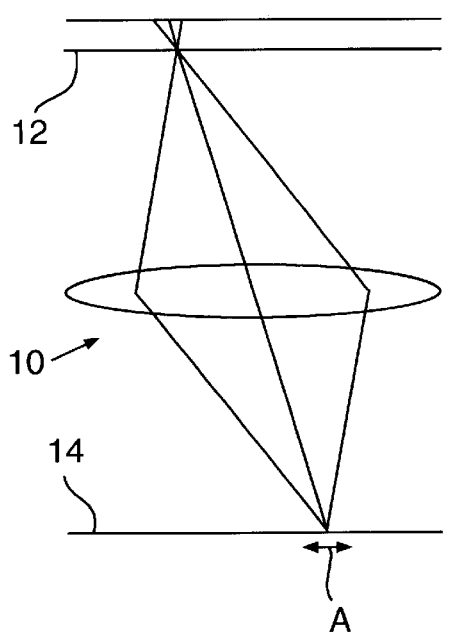
FIGS. 2(a) and (b) are diagrams of projection lens systems for illustrating non-telecentricity and telecentricity, respectively.
Figure 2:
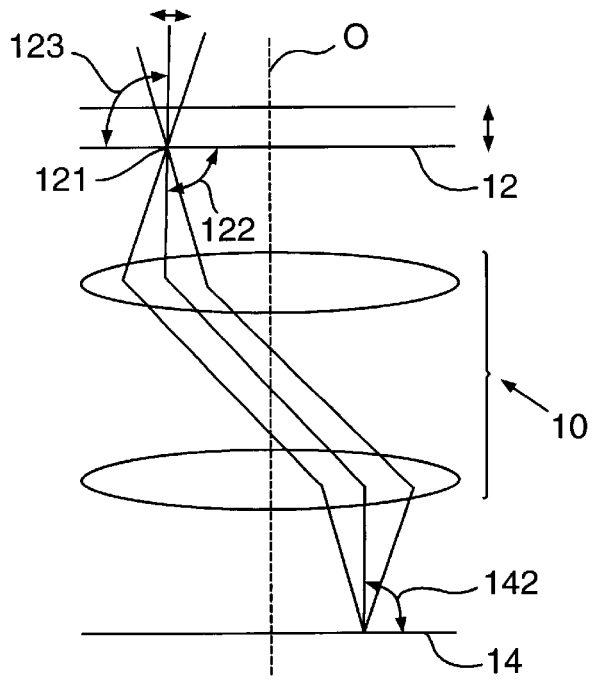

FIGS. 2(a) and (b) schematically illustrate projection systems 10 for forming an image of a first plane 12, such as a patterned surface of a reticle, at a second plane 14, such as a resist-coated surface of a wafer. FIG. 2(a) shows a non-telecentric projection system 10. Here, the term "non-telecentric" refers to a situation whereby the average angles that light rays of an image-forming radiation beam (emanating from an object point on the surface 12) subtend with the planes 12 and 14 substantially deviate from 90°. Consequently, if the reticle or wafer is moved up or down along the optical axis of the lens, the image is moved laterally, as shown by the arrows A in FIG. 2(a). In the following, we will refer to said average angles as "average beam angles". In contrast to the projection system 10 in FIG. 2(a), the projection system 10 in FIG. 2(b) is telecentric: now, the average beam angles 122 and 142 (in FIG. 2(b)) of an image-forming beam with respect to the planes 12 and 14 are substantially 90°. Consequently, the image position is not affected by moving either the object plane or the image plane. If, for example, the plane 12 is moved up or down, the position of the image does not move laterally, although it does, of course, go into and out of focus. This arrangement is clearly advantageous, for example, when it comes to overlaying successive lithographic layers.

Figure 3:
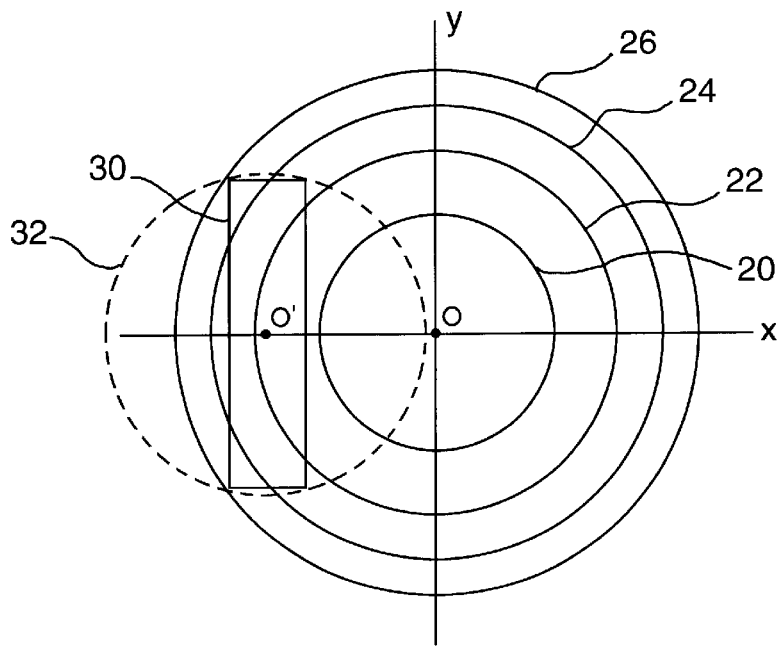
FIG. 3 illustrates the telecentricity error of a projection system in relation to an off-axis illumination system.

However, a practical projection lens system will never be perfectly telecentric. There will always be some small residual telecentricity error. Both at the object side (the side facing surface 12) and the image side (the side facing surface 14) of a telecentric projection system 10, the average beam angles 122 and 142 in FIG. 2b will deviate (slightly) from 90°. This deviation, representing the telecentricity error, will show a dependence on the lateral position of point 121 with respect to the optical axis O of the projection system. FIG. 3 represents a plan view of a projection lens system with an optical axis O, and the concentric circles 20, 22, 24 and 26 represent contours of substantially equal telecentricity error. As an example, the angular errors in milliradian (mrad) may have values such as +1, 0, −1 and −2, respectively for the contours 20 to 26. These represent the angular errors at reticle level but will of course be greater at wafer level due to the magnification factor M of the projection lens system; for example, four times greater for M=¼.

The illumination system has to deliver a telecentricity-corrected illumination beam in which the angle of incidence 123, in FIG. 2(b), varies with lateral position, such as to compensate for the intrinsic telecentricity error in the projection system 10. Ideally, the incoming beam, which illuminates point 121 in FIG. 2(b), shall directionally be such that its average beam angle 123 just matches with the average beam angle 122 defined by the telecentricity error of the projection system. However, unless precautions are taken, the residual telecentricity error of the illumination system IL will generally not match the telecentricity error of the projection system. The concept of "compensation" and the terms "compensation means" and "compensator", as used here, refer to the compensation (i.e. alleviation) of a mismatch between said telecentricity errors.

If the optical axis of the illuminator is coaxial with the projection lens system, then said telecentricity errors are axially symmetric, and therefore the compensation can be axially symmetric as well, so that it can be provided by conventional lenses. However, as explained above, it can be desirable to use off-axis projection. The rectangle 30 represents the illumination slit of an illumination system which is off-axis with respect to the optical axis O of the projection system. It is generally advantageous to minimize the size of the exit aperture of the illuminator such that it is only just large enough to encompass the slit image 30. In this case the off-axis field of the illumination system is indicated by the dashed circle 32 centered on the axis O'. Clearly the diameter of the circle 32, representative of the aperture of the illuminator, is smaller than the diameter of the aperture of the projection system, for example circle 26.

As can be seen in FIG. 3, the telecentricity error compensation to be provided by the illuminator, given by the arcs of circles 20, 22, 24 and 26 crossing the field 32 of the illuminator, is asymmetrical.

Figure 4:
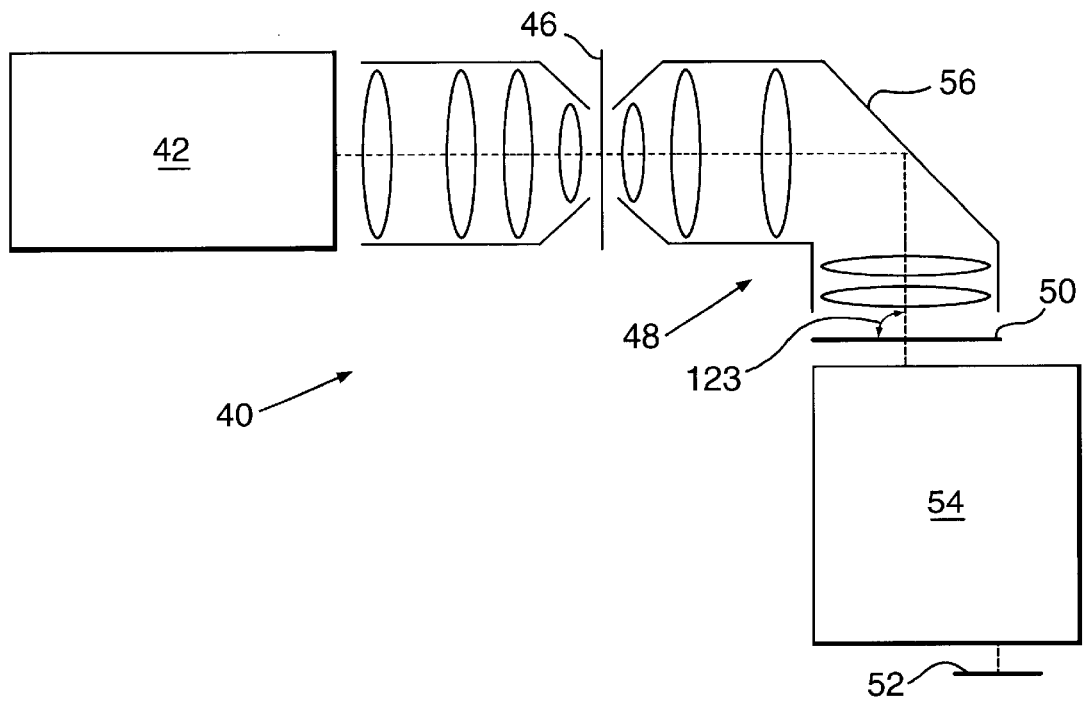
FIG. 4 illustrates an illuminator and projection system incorporating tiltable mirror telecentricity error compensating means in accordance with the invention.

FIG. 4 illustrates one embodiment of the invention for compensating for asymmetrical telecentricity deviation. FIG. 4 illustrates an illuminator 40, comprising beam shaping optics 42, such as a zoom-axicon module, and an integrator, such as a fly-eye lens or an integrator rod, field lens system, reticle masking means 46, and associated reticle masking lens system 48. The illuminator 40 provides a beam of radiation for illuminating a reticle 50, an image of which is then projected onto wafer 52 by projection system 54. The illumination incident on the reticle 50 is in the form of a slit, represented by the rectangle 30 shown in FIG. 3. The reticle 50 and wafer 52 are in this case scanned such that the slit and its image are swept across the reticle 50 and wafer 52 respectively. The illuminator 40 comprises a mirror 56. The mirror 56 is tiltable such that its angle can be selected to deviate the illumination beam (in this way, the average angle of incidence 123 of the radiation on the reticle 50 is no longer 90°) in order to compensate for the non-circularly-symmetric telecentricity error of the projection system 54.

A planar mirror 56 can be used to provide (coarse) telecentricity error compensation. However, according to another embodiment, the mirror 56 can be profiled to provide more accurate telecentricity error compensation, to correspond more closely to the necessary error compensation for a perfect match with the intrinsic telecentricity error of the projection system 10, as indicated in FIG. 3.

Figure 5:
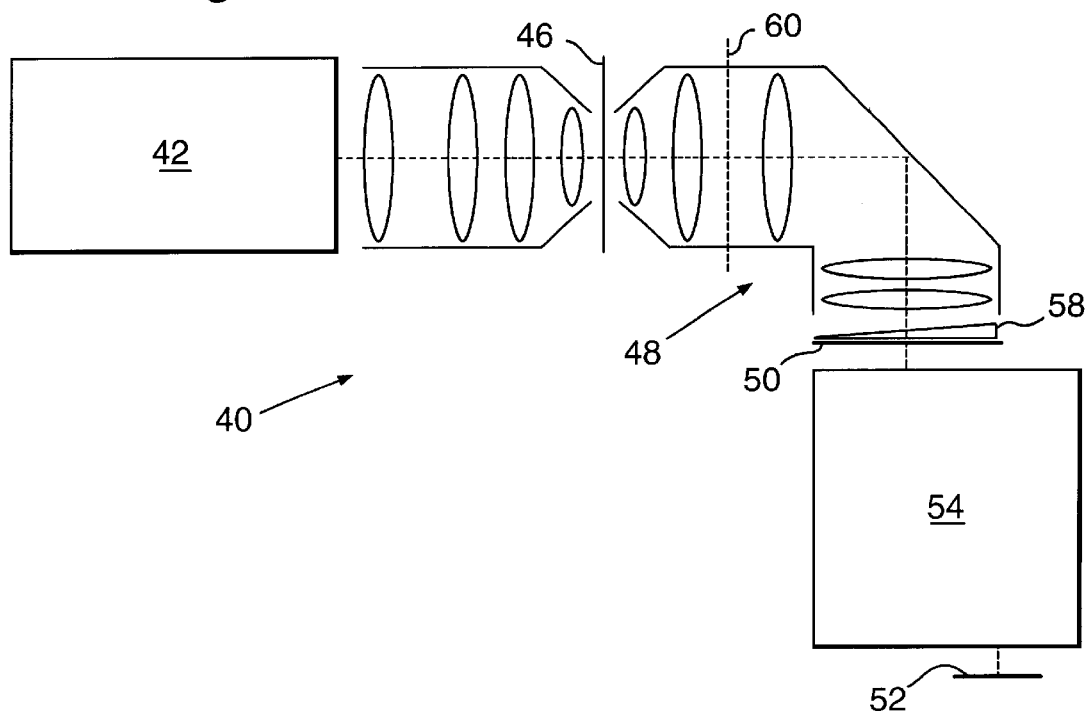
FIG. 5 illustrates an illuminator and projection system incorporating wedge-like telecentricity error compensating means.

Another embodiment of the invention is shown in FIG. 5. In this embodiment, a wedge-like transmissive optical element 58 is located in the illumination beam path. According to one embodiment, the element 58 can simply be a wedge-shaped prism for providing (coarse) telecentricity error compensation. However, referring to FIG. 3, a lens can be made of the same diameter as the aperture of the projection system and centered on the optical axis O and fabricated to compensate for the telecentricity error as, for example, indicated by the contours 20 to 26. A portion of this lens can then be cut out from one side, sufficient to cover the diameter of the illuminator 32 or at least the portion encompassed by the slit 30. This portion of the lens will be wedge-like and will have an asymmetric telecentricity error compensation as a function of position that would, in general, be very difficult to manufacture otherwise. Using this technique, at least two wedge-like elements 58 could be obtained from a single large lens. The profile of the wedge-like element 58 will be such that, at each position across it, the beam will be deviated by an angle appropriate to compensate for the telecentricity error given by the angular values (mentioned above) on the contours 20 to 26.

The optical element 58 could, in principle, be placed anywhere in the optical beam path through the illuminator 40. In one embodiment, as shown in FIG. 5, the element is placed close to the reticle 50. It then acts as a so called field lens. Field lenses typically affect the average direction of propagation of a radiation beam (the average beam angle) as a function of lateral position of the beam at the field lens, without substantially affecting the aperture of the beam. A telecentricity error compensation consists of adjusting the angle of incidence 123 of the illumination beam on the reticle 50 as a function of position, preferably without substantially affecting the aperture (σ-outer and σ-inner settings) of the illumination beam. So, a field lens generally performs this exact function. Alternatively, the optical element 58 could be placed near to the reticle masking means 46. At other positions in the illuminator 40, there is not the same distinction between position and angles; for example, the pupil plane 60 corresponds to the Fourier transform of the beam distribution at the reticle 50, such that positions in the plane 60 correspond to angles of incidence at the reticle 50. Consequently it is harder to provide the appropriate compensation for the telecentricity error at a general position in the illuminator 40. The wedge-like element 58 could, of course, be placed at other conjugate planes in the illuminator 40 because variation of angle with position would correspond between conjugate planes.

The features of the embodiment described above and illustrated in FIGS. 4 and 5, could, of course, be used in combination; for example an illuminator 40 comprising a tiltable mirror and a wedge-like optical element. Alternatively, or in addition, the wedge-like optical element could be tiltable to provide adjustment of the telecentricity error correction.

While specific embodiments of the invention have been described above, it will be appreciated that the invention may be practiced otherwise than as described. The description is not intended to limit the invention.

What is claimed is:

1. A lithographic projection apparatus comprising:

an illumination system for providing a projection beam of radiation;

a projection beam patterning structure, capable of patterning the projection beam according to a desired pattern;

a substrate table for holding a substrate;

a projection system which images the patterned beam onto a target portion of the substrate, arranged such that, in use, the patterned beam is projected off-axis with respect to an optical axis of said projection system; and a telecentricity compensating structure which compensates for telecentricity error of the projection system.

2. An apparatus according to claim 1, wherein the projection beam patterning structure comprises a mask table for holding a mask.

3. An apparatus according to claim 1, wherein an optical axis of the illumination system is laterally shifted such as to be substantially parallel to, but off-axis with respect to, the optical axis of the projection system.

4. An apparatus according to claim 1, wherein said telecentricity compensating structure is tilted with respect to the optical axis of the illumination system, to compensate for telecentricity error in the projection system.

5. An apparatus according to claim 4, wherein said telecentricity compensating structure is tiltable, to enable adjustment of the telecentricity error compensation.

6. An apparatus according to claim 1, wherein said telecentricity compensating structure comprises a reflective element.

7. An apparatus according to claim 6, wherein said reflective element has a non-planar profile.

8. An apparatus according to claim 1, wherein the telecentricity compensating structure comprises a wedge-shaped transmissive optical element.

9. An apparatus according to claim 8, wherein said wedge-shaped optical element comprises a prismatic plate.

10. An apparatus according to claim 8, wherein said wedge-shaped optical element comprises a portion of a substantially axially symmetric lens.

11. An apparatus according to claim 8, wherein said telecentricity compensating structure is located proximate to a position of the projection beam patterning structure, or at a position substantially conjugate thereto.

12. A device manufacturing method comprising:

providing a substrate that is at least partially covered by a layer of radiation-sensitive material;

providing a projection beam of radiation using a radiation system;

patterning the projection beam to produce a pattern in its cross-section;

projecting the patterned beam of radiation onto a target portion of the layer of radiation-sensitive material, wherein the patterned projection beam is projected off-axis with respect to an optical axis of said projection system; and compensating for telecentricity error of the projection system.

13. A device manufactured according to the method of claim 12.

14. An illumination system for use in a lithographic projection apparatus, serving to provide a projection beam of radiation that is subsequently patterned and projected by a projection system onto a substrate, comprising:

a telecentricity compensating structure constructed and arranged to compensate for a telecentricity error of the projection system.

* * * * *